(12) United States Patent
Lee et al.

(10) Patent No.: US 8,214,582 B2
(45) Date of Patent: *Jul. 3, 2012

(54) NON-VOLATILE MEMORY SYSTEM STORING DATA IN SINGLE-LEVEL CELL OR MULTI-LEVEL CELL ACCORDING TO DATA CHARACTERISTICS

(75) Inventors: Yang-sup Lee, Seoul (KR); Prakash Talawar, Suwon-si (KR); Chan-ik Park, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 12/711,461

(22) Filed: Feb. 24, 2010

(65) Prior Publication Data
US 2010/0153632 A1 Jun. 17, 2010

Related U.S. Application Data

(63) Continuation of application No. 11/640,304, filed on Dec. 18, 2006, now Pat. No. 7,676,626.

(30) Foreign Application Priority Data

Nov. 3, 2006 (KR) .......................... 10-2006-0108382

(51) Int. Cl.
*G06F 13/00* (2006.01)
*G11C 5/06* (2006.01)

(52) U.S. Cl. .......................................... 711/103; 365/63
(58) Field of Classification Search .................. 711/103; 365/63
See application file for complete search history.

(56) References Cited

U.S. PATENT DOCUMENTS

2004/0210706 A1* 10/2004 In et al. .......................... 711/103
2005/0057995 A1* 3/2005 Mitani et al. .................. 365/222

FOREIGN PATENT DOCUMENTS

| JP | 2001006374 | 1/2001 |
| JP | 2001306393 | 11/2001 |
| JP | 2005267676 | 9/2005 |

* cited by examiner

*Primary Examiner* — Mardochee Chery
(74) *Attorney, Agent, or Firm* — Volentine & Whitt, PLLC

(57) ABSTRACT

Provided is a system storing data received from an application or file system in a non-volatile memory system of single-level cells and multi-level cells in accordance with one or more data characteristics. The non-volatile memory system includes a non-volatile memory cell array having a plurality of multi-level cells forming a MLC area and a plurality of single-level cells forming a SLC area, and an interface unit analyzing a characteristic of the write data and generating a corresponding data characteristic signal. A flash transition layer receives the data characteristic signal, and determines whether the write data should be stored in the MLC area or the SLC area based on whether or not the write data will be accessed by the file, or whether the address associated with the write data is frequently updated or not.

7 Claims, 6 Drawing Sheets

FIG. 7A

| Blk Num | Cnt | LRU |
|---|---|---|
| 10 | 10 | 10 |
| 50 | 7 | 4 |
| 49 | 5 | 7 |
| 12 | 3 | 5 |
| – | – | – |

FIG. 7B

| Blk Num | Cnt | LRU |
|---|---|---|
| 10 | 10 | 10 |
| 50 | 7 | 4 |
| 49 | 5 | 7 |
| 12 | 3 | 5 |
| 100 | 1 | 11 |

FIG. 7C

| Blk Num | Cnt | LRU |
|---|---|---|
| 10 | 10 | 10 |
| 120 | 1 | 12 |
| 49 | 5 | 7 |
| 12 | 3 | 5 |
| 100 | 1 | 11 |

NON-VOLATILE MEMORY SYSTEM STORING DATA IN SINGLE-LEVEL CELL OR MULTI-LEVEL CELL ACCORDING TO DATA CHARACTERISTICS

CROSS-REFERENCE TO RELATED APPLICATIONS

This application is a continuation of U.S. patent application Ser. No. 11/640,304 filed on Dec. 18, 2006, which claims priority to Korean patent application number 10-2006-0108382, filed on Nov. 3, 2006. The subject matter of both of these applications is hereby incorporated by reference.

BACKGROUND OF THE INVENTION

1. Field of the Invention

The present invention relates to a non-volatile memory system. More particularly, the invention relates to a non-volatile memory system storing data in a single-level cell or a multi-level cell according to one or more characteristics of the data.

This application claims the benefit of Korean Patent Application No. 10-2006-0108382, filed on Nov. 3, 2006, the subject matter of which is hereby incorporated by reference.

2. Description of the Related Art

Non-volatile memory systems, such as those using flash memory, have found increasing application in variety of host devices, such as computers, cellular telephones, digital video devices, etc.

Non-volatile memory systems have historically been built around either single bit (or level) memory cells or multiple level memory cells. The use of single level memory cells offers performance advantages, while the use of multi-level memory cells allows greater data storage capacity per unit chip area.

More recently, however, non-volatile memory systems including both a single-level cell and a multi-level cell have been proposed. Such memory systems provide increased operating flexibility in that single-level memory cells may be accessed when high performance and endurance are required, while the provision of multi-level memory cells improves data storage capacity and price competitiveness. However, to efficiently use both single-level and multi-level memory cells in a common memory system, some capability must exist for determining whether or not received data should be stored in single-level or multi-level memory cells.

SUMMARY OF THE INVENTION

Embodiments of the invention provide a non-volatile memory system storing data in single-level or multi-level memory cells in accordance with one or more characteristics of the data.

In one embodiment, the invention provides a system storing write data received from at least one of an application and a file system in a non-volatile memory system, the non-volatile memory system comprises; a non-volatile memory cell array having a plurality of multi-level cells forming a MLC area and a plurality of single-level cells forming a SLC area, an interface unit analyzing a characteristic of the write data and generating a corresponding data characteristic signal, and a flash transition layer determining whether the write data should be stored in the MLC area or the SLC area on the basis of the data characteristic signal.

The interface unit may be located on the same abstraction layer on which the application or the file system is located.

The interface unit may also be located on a different abstraction layer than the flash transition layer.

The interface unit may comprise a file system interface that analyzes the characteristic of write data received from the file system and communicates a corresponding data characteristic signal to the flash transition layer, or an application interface that determines whether an address associated with write data received from the application is frequently updated and communicates a corresponding data characteristic signal to the flash transition layer.

The flash transition layer may comprise a hybrid algorithm unit that determines that the write data should be written to the SLC area or the MLC area on the basis of the data characteristic signal, or a mapping unit capable of mapping an address for the write data into a physical address for the non-volatile memory cell array.

In another embodiment, the invention provides in a system storing write data received from at least one of an application and a file system in a non-volatile memory system, the non-volatile memory system comprises; a non-volatile memory cell array having a plurality of multi-level cells forming a MLC area and a plurality of single-level cells forming a SLC area, and a flash transition layer analyzing a characteristic of the write data and generating a corresponding data characteristic signal and determining whether the write data should be stored in the MLC area or the SLC area on the basis of the data characteristic signal.

The flash transition layer may comprise; a file system aware unit determining whether write data received from the file system is accessed by the file system and generating a corresponding data characteristic signal, an application aware unit determining whether an address associated with write data received from the application is frequently updated and generating a corresponding data characteristic signal, and a hybrid algorithm unit determining whether the write data received respectively from the application and the file system should be written to the MLC area or the SLC area on the basis of either data characteristic signal generated by the file system aware unit and the application aware unit.

The flash transition layer may further comprise a data block history storage unit including a plurality of entries; each entry comprising a data block number identifying a corresponding data block, a count value indicating a number of times the corresponding data block has been accessed by the system, and a least recently used value.

BRIEF DESCRIPTION OF THE DRAWINGS

FIG. 7 is a diagram further illustrating the operation of a data block history storage unit according to an embodiment of the invention.

DESCRIPTION OF EMBODIMENTS

Figure 1:
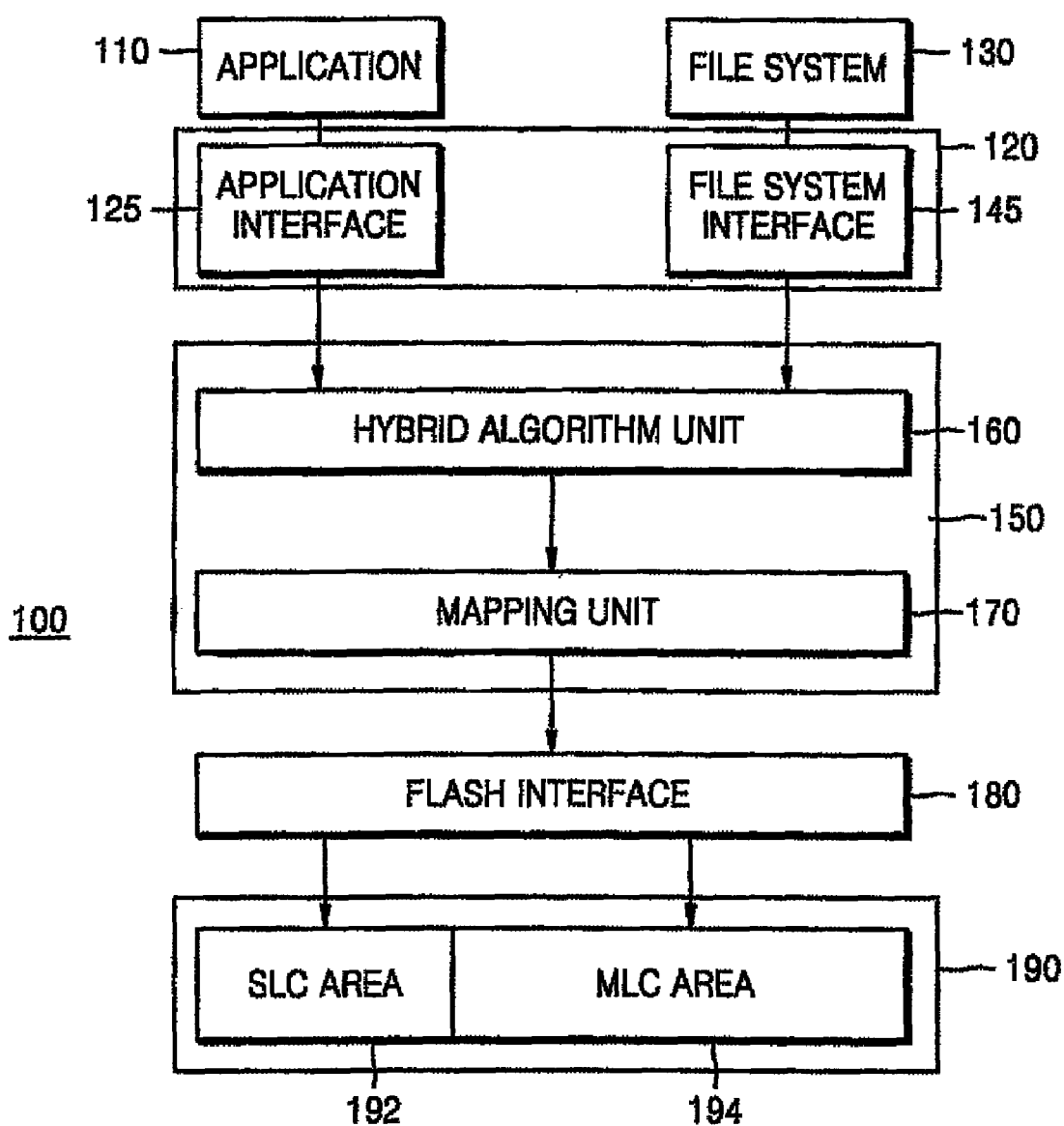
FIG. 1 is a block diagram of a general computational system according to an embodiment of the present invention.

Embodiments of the invention will now be described in some additional detail with reference to the accompanying drawings. The invention may, however, be embodied in many different forms and should not be construed as being limited to only the embodiments set forth herein. Rather, these embodiments are presented as teaching examples. Throughout the written description and drawings, like reference numerals indicate like or similar elements.

FIG. 1 is a block diagram of a general system 100 according to an embodiment of the invention. Referring to FIG. 1, a non-volatile memory system within system 100 includes a non-volatile memory cell array 190, an interface unit 120, and a flash transition layer 150. An application 110 and a file system 130 are also shown in FIG. 1 for convenience of explanation. Those of ordinary skill in the art will recognize that application 110 and/or file system 130 may be variously implemented in software and/or hardware. For example, application 110 may be a program running on an operating system within a host device. The operating system and/or application 110 may control file system 130.

In the illustrated example, non-volatile memory cell array 190 includes a plurality of multi-level cells (MLC) located in a MLC area 194 and a plurality of single-level cells (SLC) located in a SLC area 192. The term "area" is used here to generally denote a collection of memory cell types. Such SL and ML memory cells need not be separately provided in distinct regions, but may be provided in any reasonable fashion. Interface unit 120 shown in FIG. 1 conceptually represents specialized software and/or hardware adapted to interface application 110 and file system 130 with the memory cell resources provided by memory system 100. Interface unit 120 receives and analyzes the characteristics of data received from file system 130, for example, and generate a corresponding data characteristic signal. In response to the data characteristic signal, flash transition layer 150 determines whether the data should be written to MLC area 194 or SLC area 192.

In one embodiment, interface unit 120 is located on the same abstraction layer on which application 110 and file system 130 are located. Interface unit 120 may therefore be located on a different abstraction layer within system 100 than flash transition layer 150. With this architecture, interface unit 120 may readily analyze one or more characteristics of write data received from an external source responsive to application 110 and/or file system 130.

Interface unit 120 may be conceptually viewed as having a file system interface 145 and an application interface 125. File system interface 145 may be used to determine characteristics of "write data" being communicated from file system 130 through flash transition layer 150. For example, file system interface 145 may determine whether the address associated with the write data corresponds to a designated FAT region and/or meta data region of an external memory. The determination result is then communicated to flash transition layer 150 as a data characteristic signal.

In the illustrated example, flash transition layer 150 include a hybrid algorithm unit 160 and a mapping unit 170. Hybrid algorithm unit 160 decides whether the write data should be written to SLC area 192 or the MLC area 194 on the basis of the data characteristic signal. For example, when the write data is associated with a particular functionality of or data type within file system 130, a determination may be made that such data should be written to SLC area 192. In contrast, write data associated with sources other than file system 130 may result in a determination that such data should be written to MLC area 194. In one embodiment, write data that is frequently accessed ("frequently updated data") by file system 130 will be stored in SLC area 192 of non-volatile memory cell array 190.

In the illustrated example, application interface 125 within interface unit 120 may be used to determine whether a write data address indicates "frequently updated data", and communicate a corresponding data characteristic signal to flash transition layer 150.

Figure 3:
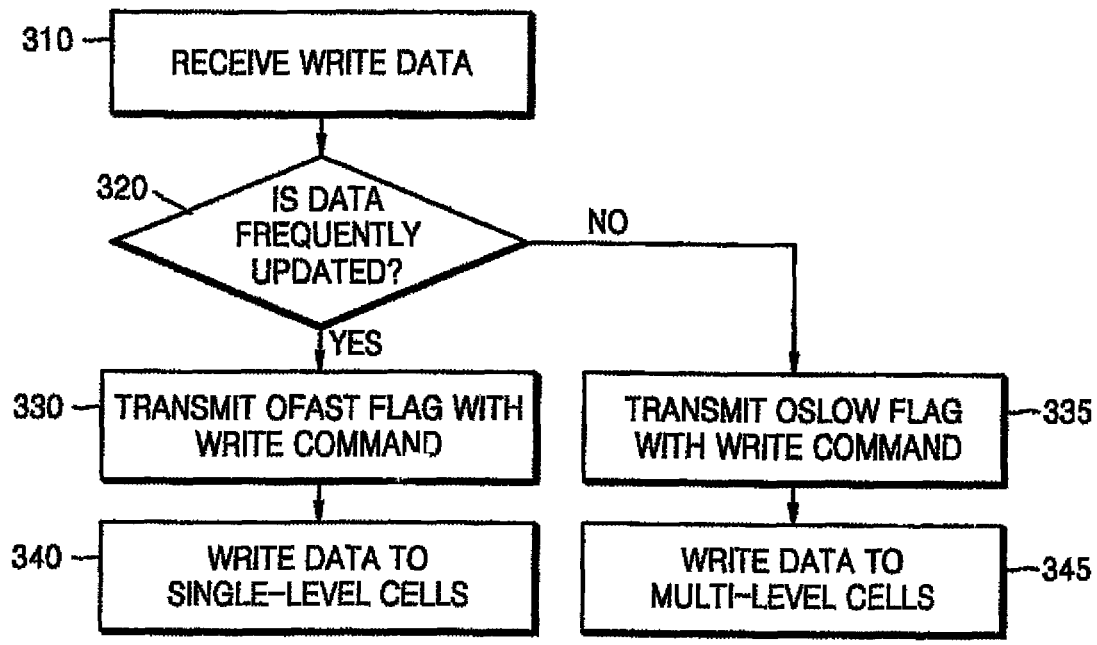
FIG. 3 is a flow chart of an exemplary method, consistent with an embodiment of the invention, executable in a file system interface and/or a flash transition layer during a data write operation within a non-volatile memory system such as the one illustrated in FIG. 1.

FIG. 3 is a flow chart of an exemplary method executable by file system interface 145 and/or flash transition layer 150 during a data write operation within system 100 incorporating non-volatile memory cell array 190, as described in relation to FIG. 1. Referring to FIG. 3, file system interface 145 receives data to be written to non-volatile memory cell array 190 (hereafter "write data") from file system 130 (310). File system interface 145 determines whether the write data is associated with an address that is frequently updated (320). When the write data is associated with a frequently updated address, file system interface 145 sets an OFAST flag value in a location accessible to flash transition layer 150, as one particular form of a data characteristic signal (330). In contrast, when the write data is not associated with a frequently updated address, file system interface 145 sets an OSLOW flag value (335). Either one of these flag values may subsequently be communicated in relation to (or define) a respective write command identifying SLC area 192 or MLC area 194 within non-volatile memory cell array 190 (340 or 345). However, those of ordinary skill in the art will recognize that there are many other ways to implement a data characteristic signal.

Figure 4:
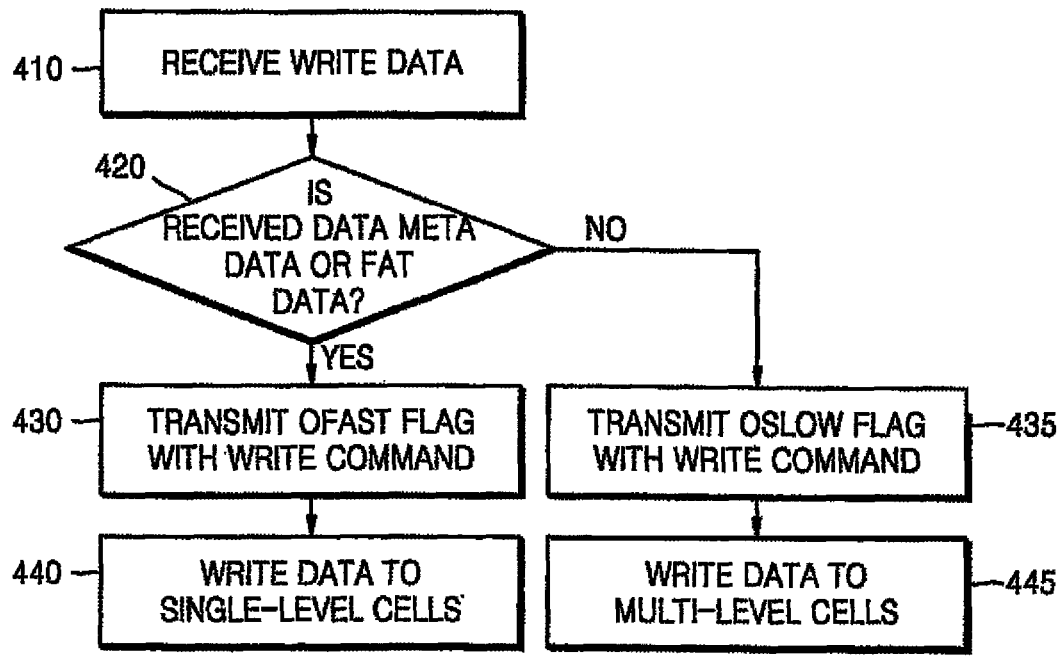
FIG. 4 is a flow chart of an exemplary method, consistent with an embodiment of the invention, executable in an application interface and/or a flash transition layer during a data write operation in a non-volatile memory system such as the one illustrated in FIG. 1.

FIG. 4 is a flow chart of an exemplary method executable by application interface 125 and/or flash transition layer 150 during a data write operation within system 100 incorporating non-volatile memory cell array 190, as described in relation to FIG. 1. Referring to FIG. 4, application interface 125 receives write data from application 110 (410). Then, application interface 125 determines whether the write data is meta data or FAT data (420). There are various techniques for doing this, such as reference to header data associated with the write data. In one embodiment consistent with the example presented in FIG. 3, when the write data is meta data or FAT data, application interface 125 sets the OFAST flag value in a location accessible by flash transition layer 150, as one form of a data characteristic signal. However, when the write data is not meta data or FAT data, application interface 125 sets the OSLOW flag value (430, 435). Here again, either one of these flag values may subsequently be communicated in relation to (or define) a respective write command identifying SLC area 192 or MLC area 194 within non-volatile memory cell array 190 (440 or 445).

In relation to either one or both of the foregoing exemplary methods, hybrid algorithm unit 160 of flash transition layer 150 may be used to determine whether the write data should be written to SLC area 192 or MLC area 194 in response a received data type signal or an address frequency update signal. In this regard, the data type (e.g. meta data or FAT data) signal may in certain embodiments be inherently related to a frequency of access characteristic. Thus, in the foregoing exemplary methods, write data associated with frequently accessed address locations or identified as a frequently accessed type of data result in such data being stored in SLC area 192. Other types of data associated with less frequently accessed addresses or less frequently accessed data types are conversely stored in MLC area 194.

Figure 2:
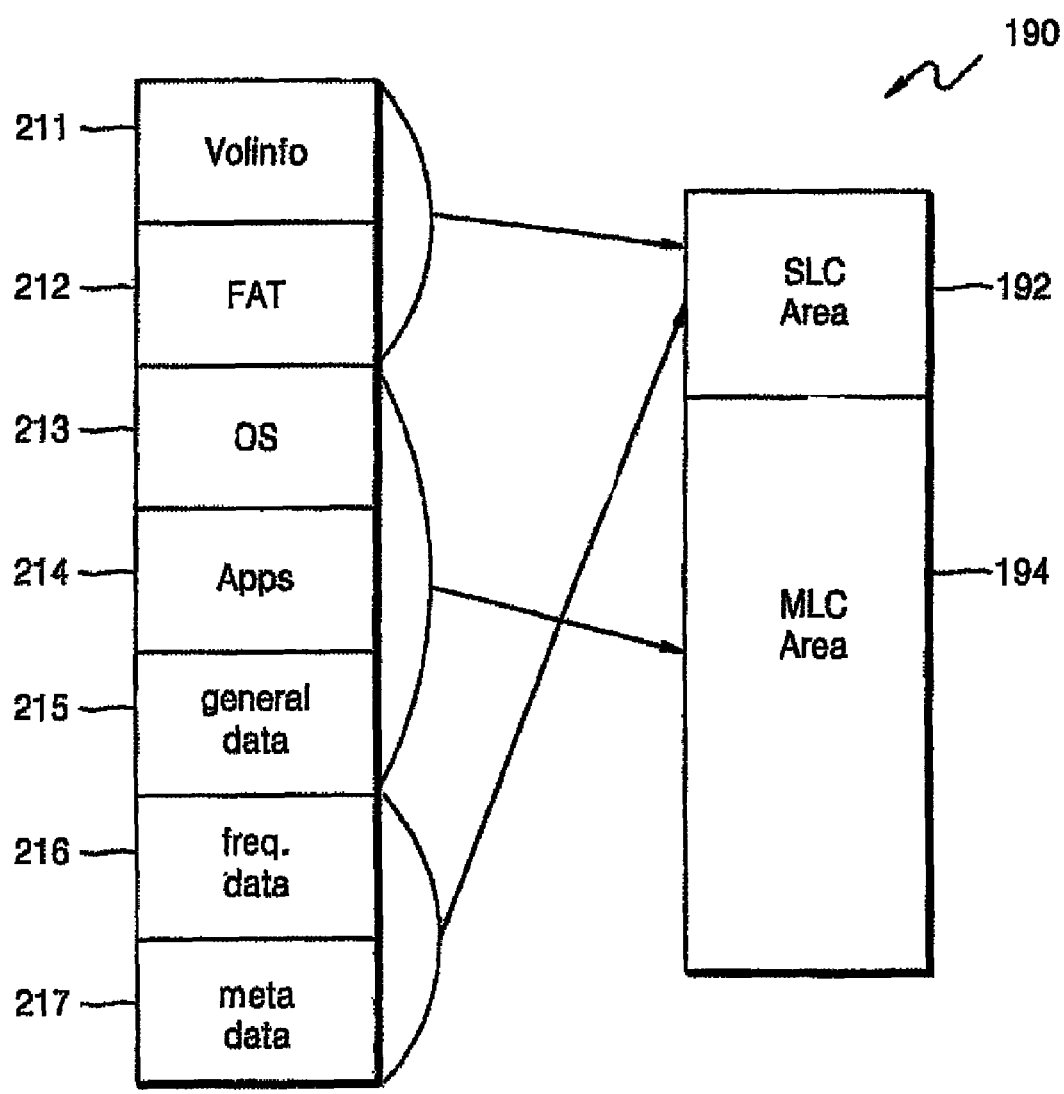
FIG. 2 is a diagram illustrating an approach, consistent with an embodiment of the present invention, of determining single-level verses multi-level memory cell storage of data according to its characteristics.

FIG. 2 is a conceptual diagram illustrating various data types commonly found or generated by contemporary applications. These are merely selected examples, and each particular application will have its own "fast" and "slow" data types. However, in the illustrated example, Volinfo data 211, frequently (freq.) accessed address data 216 and meta data 217 are indicated as "fast" data that should be written to SLC area 192. In contrast, operating system (OS) data 213, application (Apps) data 214, and general data 215 are indicated as "slow" data that should be written to MLC 194. Differentiation between fast and slow data types in this regard may be had by reference to the address of the data as stored in an external memory, associated data header information, an external command or command type, etc.

For example, write operations are commonly performed to non-volatile memory cell array 190 using the same address as the address of data stored in a FAT region of a memory. As most FAT memory regions are implemented using single level memory cells, it is preferable in some embodiments that data from the FAT region be written to SLC area 192 to avoid data translation overhead. Meta data is commonly used to accomplish write buffering and mapping functions associated with flash transition layer 150. As such, meta data is frequently updated. It is therefore preferable in some embodiments that meta data be written to SLC area 192. This is similarly true for other frequently updated data.

Referring back to FIG. 1, flash transition layer 150 may further include a mapping unit 170. Mapping unit 170 maps the address of write data into a physical address identifying specific memory cells within non-volatile memory cell array 190. This function may be implemented in various conventionally understood methods.

Figure 5:
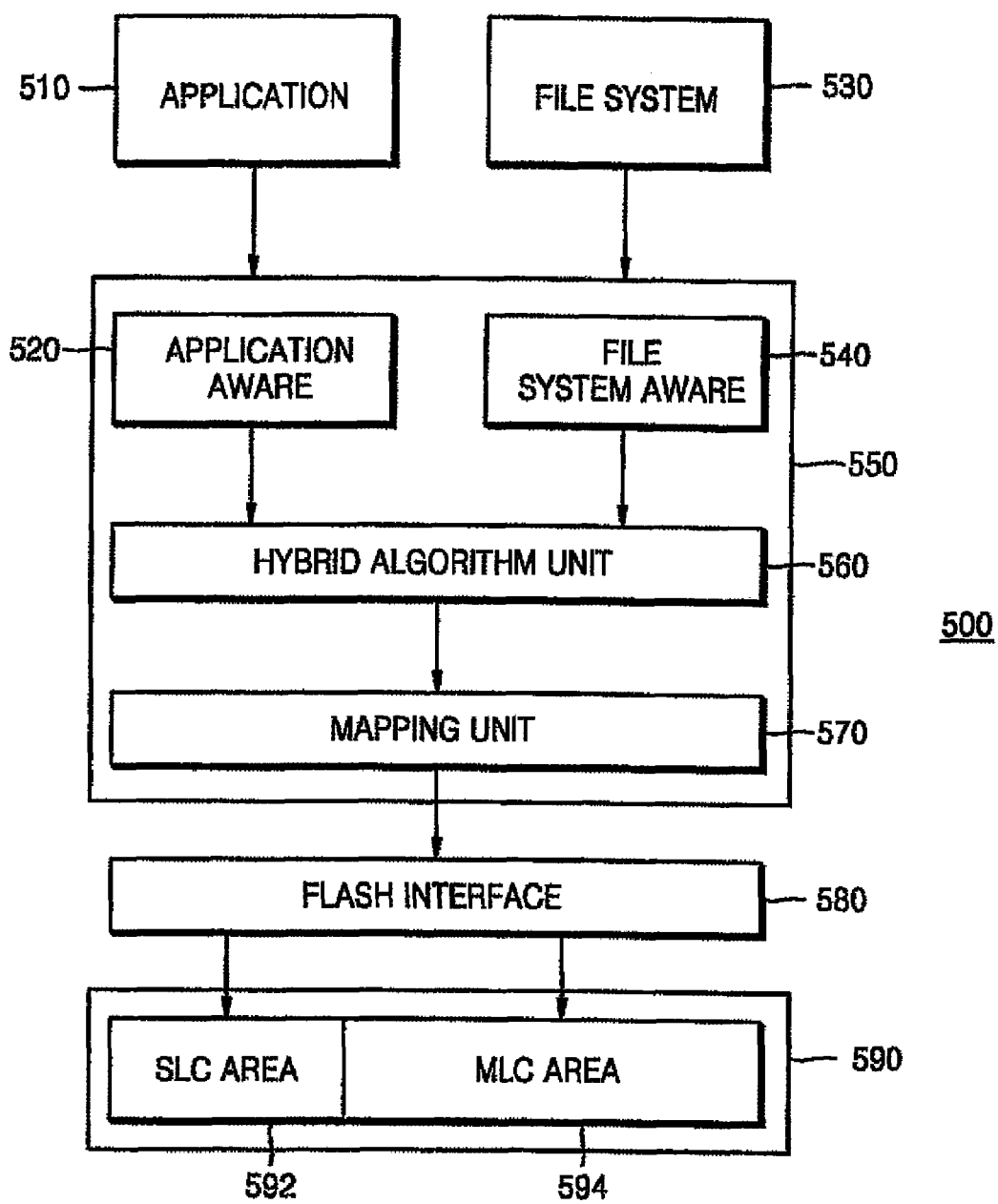
FIG. 5 is a block diagram of a general computational system according to another embodiment of the present invention.

FIG. 1 is a block diagram of a general system 100 according to an embodiment of the invention. Referring to FIG. 5, system 500 includes a non-volatile memory cell array 590 and a flash transition layer 550. Non-volatile memory cell array 590 includes a plurality of multi-level cells in a MLC area 594 and a plurality of single-level cells in a SLC area 592. Flash transition layer 550 receives write data from an application 510 and/or a file system 530 and stores that write data in MLC area 594 or SLC area 592 of non-volatile memory cell array 590 in accordance with one or more characteristics.

In contrast to system 100 of FIG. 1, flash transition layer 550 of FIG. 5 includes include a file system aware unit 540 and an application aware unit 520 in addition to a hybrid algorithm unit 560. The functionality provided by application interface 125 and file system interface 145 may be subsumed in these additional flash translation layer units. This capability is particularly useful when the host device incorporating a memory system consistent with the subject invention has limited interface capabilities.

File system aware unit 540 may be used to determine whether write data received from file system 530 or some other source has one or more characteristics indicating "fast" data to be stored in SLC area 592. Application aware unit 520 may be used to make a similar determination in relation to write data received from application 510. File system aware unit 540 and/or application aware unit 520 may communicate any number of data characteristic indications in this regard (e.g., a frequently accessed address signal, a data type signal, etc.).

In response to the data characteristic indications from these units, hybrid algorithm unit 560 may be used to determine whether the write data from application 510 or file system 530 should be written to MLC area 594 or SLC area 592 of non-volatile memory cell array 590.

In one embodiment, file system aware unit 540 is used to determine whether the write data has an address corresponding to a FAT memory region and/or an address corresponding to meta data region of an external memory.

in one embodiment, hybrid algorithm unit 560 may be used to determine that data being stored and accessed by file system 530 should be stored in SLC area 592. Hybrid algorithm unit 560 will thus determine that write data received from or accessed by other sources should be stored in MLC area 594.

In one embodiment, hybrid algorithm unit 560 may be used to determine that the write data should be written to SLC area 592 when the address of the data is frequently updated. Data associated with less frequently updated addresses will be written to MLC area 594.

Flash transition layer 550 may further include a data block history storage unit, such as those conceptually illustrated in FIG. 7. Such data block history storage unit may be used to store a plurality of entries. Each entry contains information about a data block number of a data block corresponding thereto, as well as the number of times the data block has been accessed, updated in sequence, etc. In the embodiment illustrated in FIG. 5, application aware unit 520 may be used to reference the data block history storage unit and determine whether an address associated with certain write data is frequently updated.

Figure 6:
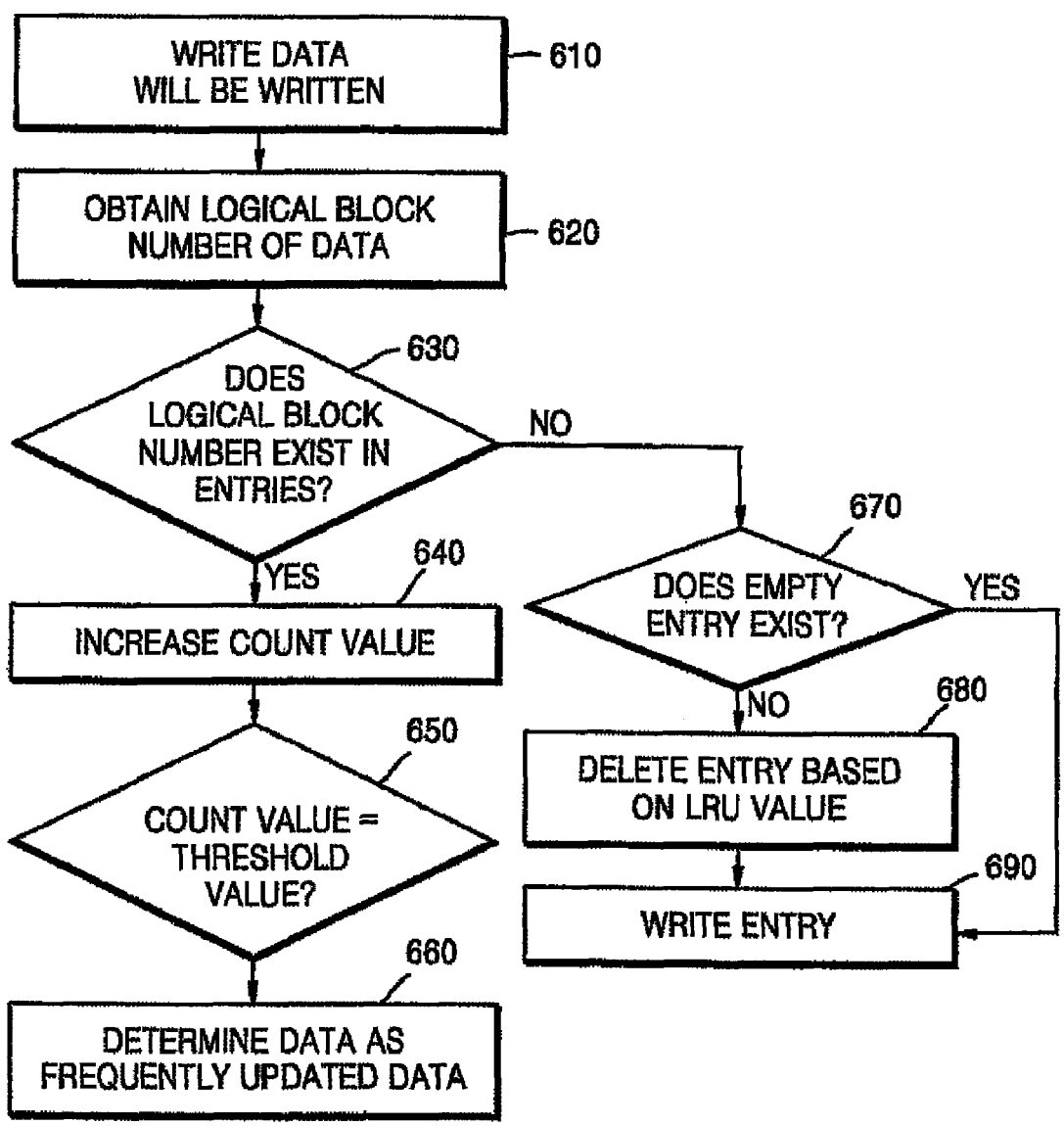
FIG. 6 is a flow chart of an exemplary method, consistent with an embodiment of the invention, executable in an application data determination unit within a non-volatile memory system such as the one illustrated in FIG. 5.

FIG. 6 is a flow chart of an exemplary method executable within application aware unit 520, and FIG. 7 is a conceptual diagram of corresponding data block history storage units.

Application aware unit 520 obtains a logic block number (Blk Num) of received write data (610, 620) and determines whether the received logic block number is identical to one of the data block number entries already stored in a data block history storage unit (630). When the received logic block number is identified as one of the stored data block number entries in the data block history storage unit, a count value (Cnt) associated with the entry is incremented (640). When the count value for a particular logic block number reaches a defined threshold value, the corresponding block of write data is identified as "frequently updated data" (650, 660).

However, when the logic block number is found as an entry in the data block history storage unit, application aware unit 520 identifies whether the data block history storage unit has an empty entry (670).

When the data block history storage unit does not have an empty entry, the entry having the smallest least recently used (LRU) value is deleted (680), and an entry for the write data is made newly allocated entry position within the data block history storage unit (690).

The sequential update of an exemplary data block history storage unit is shown in the data progression between FIGS. 7(a) through 7(c). The data block history storage unit initially has the entries shown in FIG. 7(a). Then an additional entry is made in FIG. 7(b) for write data associated with a logic block number 100. Note that this entry has a single count value of 1 and a LRU value of 11—the highest LRU value in the data block history storage unit. Subsequently, another entry is required, but the data block history storage unit has a maximum number of entries. Thus, as shown in FIG. 7(c), the oldest entry (i.e., the least recently used data—as indicated by the lowest LRU value) is deleted and replaced by a new entry associated with write data having a logic block number of 120.

This approach is just one of many approaches that may be used to identify certain data as "frequently updated data". Based on this identification, a determination may be subsequently made with a non-volatile memory system as to whether the write data should be stored in a single-level memory cell or a multi-level memory cell portion of memory. In this regard, the "frequently updated data" status is just one of many characteristics upon which such a determination may be made to improve overall performance of the memory system.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A non-volatile memory system comprising:
   a non-volatile memory cell array having a plurality of multi-level cells forming a first area and a plurality of single-level cells forming a second area and configured to store write data at one of the first area and the second area; and
   a flash transition layer (FTL) configured to determine whether the write data should be stored in the first area or the second area based on a write data characteristic signal defined by an update characteristic of the write data,
   wherein the update characteristic of the write data is the number of access of an address associated with the write data,
   the FTL comprises a plurality of entries including at least one store entry and at least one empty entry,
   the FTL stores the number of access of the address to the empty entry, if there is no store entry corresponding to the address, and the FTL stores the number of access to the store entry selected in response to a least recently used (LRU) value, if there is no store entry corresponding to the address and no empty entry.

2. The system of claim 1, wherein the FTL stores the number of access of the address to the store entry, if there is the store entry allocated to the address.

3. The system of claim 1, wherein each store entry is allocated to a corresponding address of the write data.

4. The system of claim 1, wherein each entry is included in a data block history storage.

5. The system of claim 1, wherein each entry further stores the LRU value.

6. The system of claim 1, wherein the FTL generates the write data characteristic signal.

7. The system of claim 1, wherein write data characteristic signal is received from the at least one of an application and a file system.

* * * * *